(12) United States Patent
Agrawal et al.

(10) Patent No.: US 12,255,644 B2
(45) Date of Patent: Mar. 18, 2025

(54) AUDIO INTERFACE PHYSICAL LAYER

(71) Applicant: TEXAS INSTRUMENTS INCORPORATED, Dallas, TX (US)

(72) Inventors: Atul Kumar Agrawal, Bangalore (IN); Abhijit Patki, Bangalore (IN); Shaik Basha, Bangalore (IN)

(73) Assignee: Texas Instruments Incorporated, Dallas, TX (US)

( * ) Notice: Subject to any disclaimer, the term of this patent is extended or adjusted under 35 U.S.C. 154(b) by 113 days.

(21) Appl. No.: 18/058,988

(22) Filed: Nov. 28, 2022

(65) Prior Publication Data

US 2024/0178838 A1    May 30, 2024

(51) Int. Cl.
| | | |
|---|---|---|
| H03K 19/00 | (2006.01) | |
| G06F 3/16 | (2006.01) | |
| H03K 5/01 | (2006.01) | |
| H03K 19/21 | (2006.01) | |
| H04R 3/00 | (2006.01) | |
| H04R 3/12 | (2006.01) | |
| H03K 5/00 | (2006.01) | |

(52) U.S. Cl.
CPC ......... *H03K 19/0002* (2013.01); *G06F 3/162* (2013.01); *H03K 5/01* (2013.01); *H03K 19/21* (2013.01); *H04R 3/005* (2013.01); *H04R 3/12* (2013.01); *H03K 2005/00013* (2013.01); *H04R 2430/01* (2013.01)

(58) Field of Classification Search
CPC ............ H03K 19/0826; H03K 19/094; H03K 19/09429; H03K 19/0944; H03K 19/20; H03K 19/21; H03K 19/215
See application file for complete search history.

(56) References Cited

U.S. PATENT DOCUMENTS

| | | | | |
|---|---|---|---|---|
| 5,172,397 A | * | 12/1992 | Llewellyn | H04L 7/033 327/263 |
| 5,233,617 A | * | 8/1993 | Simmons | H03K 3/0375 327/198 |
| 6,002,733 A | * | 12/1999 | Kim | H04L 23/00 375/377 |
| 6,081,572 A | * | 6/2000 | Filip | H03L 7/113 329/307 |
| 6,728,320 B1 | * | 4/2004 | Khasnis | H04L 25/4904 375/257 |
| 7,627,070 B2 | * | 12/2009 | Cauchy | H04N 21/4302 375/376 |

(Continued)

OTHER PUBLICATIONS

Rhyne "Fundamentals of Digital System Design" N.J. pp. 70-71 (Year: 1973).*

*Primary Examiner* — Jason M Crawford
(74) *Attorney, Agent, or Firm* — Valerie M. Davis; Frank D. Cimino

(57) ABSTRACT

An integrated circuit (IC) includes a tristatable output buffer having a control input. The IC includes an input buffer having a buffer output. The IC further includes a delay circuit having a delay circuit input, a first delay circuit output, and a second delay circuit output. The delay circuit input is coupled to the buffer output. The IC also includes a tristate circuit coupled to the first delay circuit output and to the second delay circuit output. The tristate circuit having a tristate circuit output coupled to the control input.

20 Claims, 7 Drawing Sheets

(56) References Cited

U.S. PATENT DOCUMENTS

| | | | |
|---|---|---|---|
| 8,018,250 B1 * | 9/2011 | Klein | H03K 19/177 710/302 |
| 11,588,486 B1 * | 2/2023 | Mizuta | H03K 19/094 |
| 2003/0145145 A1 * | 7/2003 | Muroor | G06F 13/4072 710/113 |
| 2016/0072492 A1 * | 3/2016 | Amarilio | G11C 19/00 710/110 |
| 2024/0178838 A1 * | 5/2024 | Agrawal | H03K 19/21 |

* cited by examiner

AUDIO INTERFACE PHYSICAL LAYER

BACKGROUND

Some electrical systems include multiple devices that exchange information between each other over a common electrical bus. In some systems, any of the devices interconnected by the common bus can drive data onto the bus. To prevent bus contention, in which two devices attempt to drive data on the bus at the same time, only one device is permitted to actively drive data on the bus at any point in time. When one device has transmitted the last of its data on the bus, that device should "release" the bus to allow another device to secure control of the bus to drive its own data. Releasing the bus may include causing an output buffer to be tristated so as to not to actively attempt to force any particular voltage on the bus. During this period, a "bus keeper" circuit may hold the data line at a target voltage

SUMMARY

In one example, an integrated circuit (IC) includes a tristatable output buffer having a control input. The IC includes an input buffer having a buffer output. The IC further includes a delay circuit having a delay circuit input, a first delay circuit output, and a second delay circuit output. The delay circuit input is coupled to the buffer output. The IC also includes a tristate circuit coupled to the first delay circuit output and to the second delay circuit output. The tristate circuit having a tristate circuit output coupled to the control input

DETAILED DESCRIPTION

Figure 1:
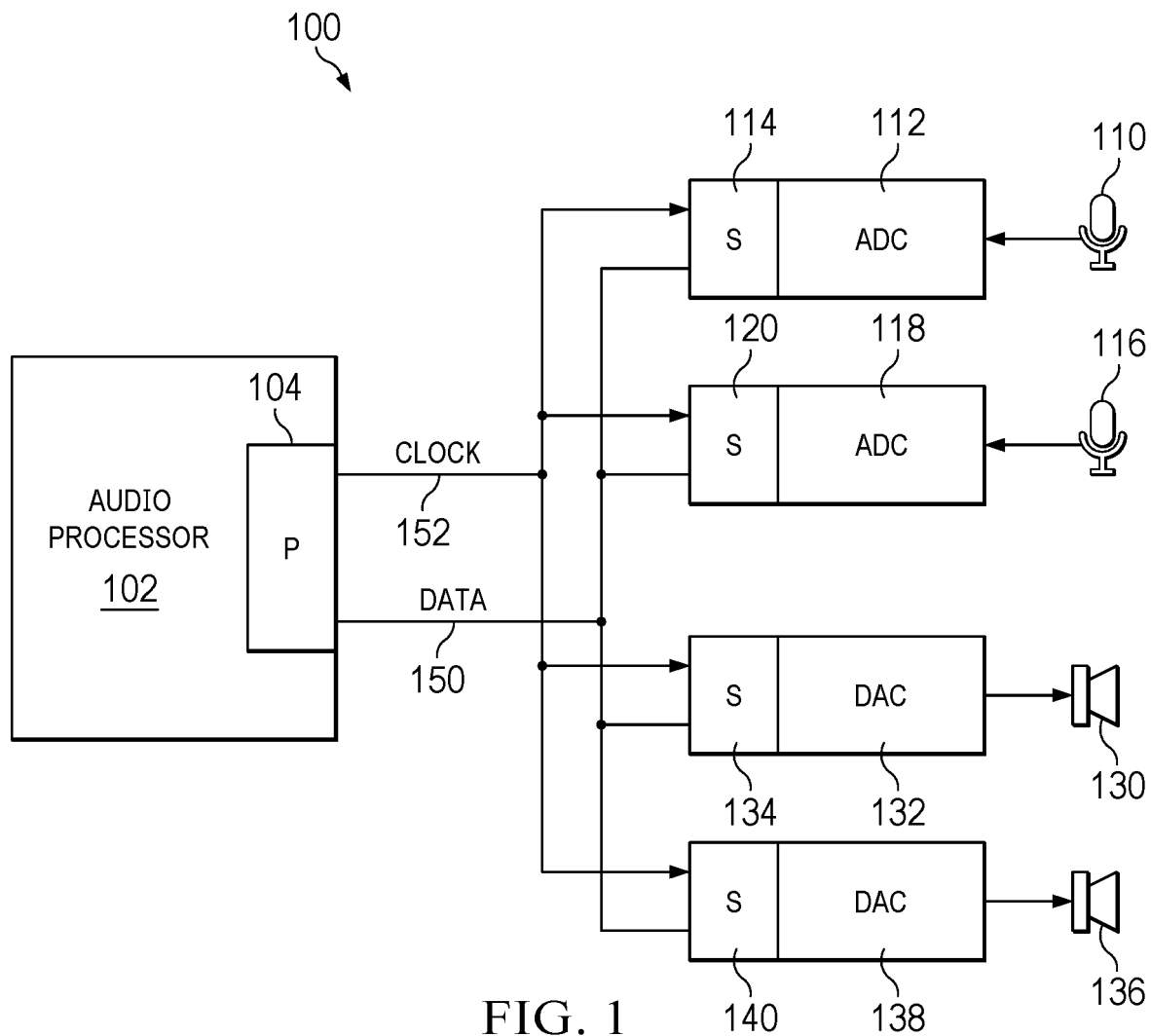
FIG. 1 is a block diagram of an audio system, in an embodiment.

The same reference numbers or other reference designators are used in the drawings to designate the same or similar (either by function and/or structure) features.

Some bus protocols impose timing requirements related to the speed at which data is to be transmitted on the bus and the speed at which a device's output driver is to be tristated following completion of its data transmission phase. These timing requirements can be difficult to meet at faster data rates. Further, some bus protocols are double data rate protocols in which data is transmitted on both edges (rising and falling) of a clock signal. The Soundwire® protocol (e.g., MIPI Soundwire® ver. 1.2.1) is an example of a double data rate protocol. According to the Soundwire® protocol, a device that is completing the transmission of the last of its bits should tristate its output buffer within 4 nanoseconds (ns) of the next clock edge so that another device on the bus can use the bus to transmit its own data. Responding to a clock edge to tristate an output buffer in less than 4 ns can be challenging.

The embodiments described herein address this type of timing problem. The described embodiments are presented in the context of a Soundwire® protocol but can apply to other types of bus protocols. FIG. 1 shows an example of an audio system 100 that implements a Soundwire® protocol. Audio system 100 includes an audio processor 102, microphones 110 and 116, and speakers 130 and 136. Analog audio signals from the microphones 110 and 116 are converted to a digital format by the respective analog-to-digital converters (ADCs) 112 and 118 and transmitted over a date bus 150 to the audio processor 102. Data from the audio processor 102 is transmitted over the data bus 150 to the digital-to-analog converters (DACs) 132 and 138 for the respective speakers 130 and 136. The audio processor 102 generates a clock signal 152, which is used by the audio processor 102 as well as provided to the ADCs 112 and 118 and to the DACs 132 and 138.

The audio processor 102 is referred to herein as the "primary" device. Each of the ADCs 112 and 118 and each of the DACs 132 and 138 is referred to herein as a "secondary" device. The primary device (audio processor 102) includes a physical (PHY) layer circuit P 104 ("P" connotes primary). Each ADC 112 and 118 includes or is coupled to a PHY layer circuit S 114 and 120 ("S" connotes secondary). Similarly, DAC 132 and 138 includes or is coupled to a PHY layer circuit S 134 and 140. The PHY layer circuits P 104, S 114, S 120, S 134, and S 140 provide the electrical connectivity of each respective device to the bus (both data 150 and clock 152).

When the audio processor 102 has audio data to be provided to speakers 130 and/or 136, the audio processor 102 gains control of the Soundwire® bus (data bus 150) and activates its output driver (not specifically shown in FIG. 1) to drive the audio data on the bus. The respective DACs 132 and 138 convert the received digital data to an analog format for conversion to sound signals by speakers 130 and 136. When a microphone 110 and/or 116 detects an audio signal, the respective ADC 112 and 118 gains control of the data bus 150 and converts the microphone's output signal to a digital format for transmission across the bus to the audio processor 102.

Figure 2:
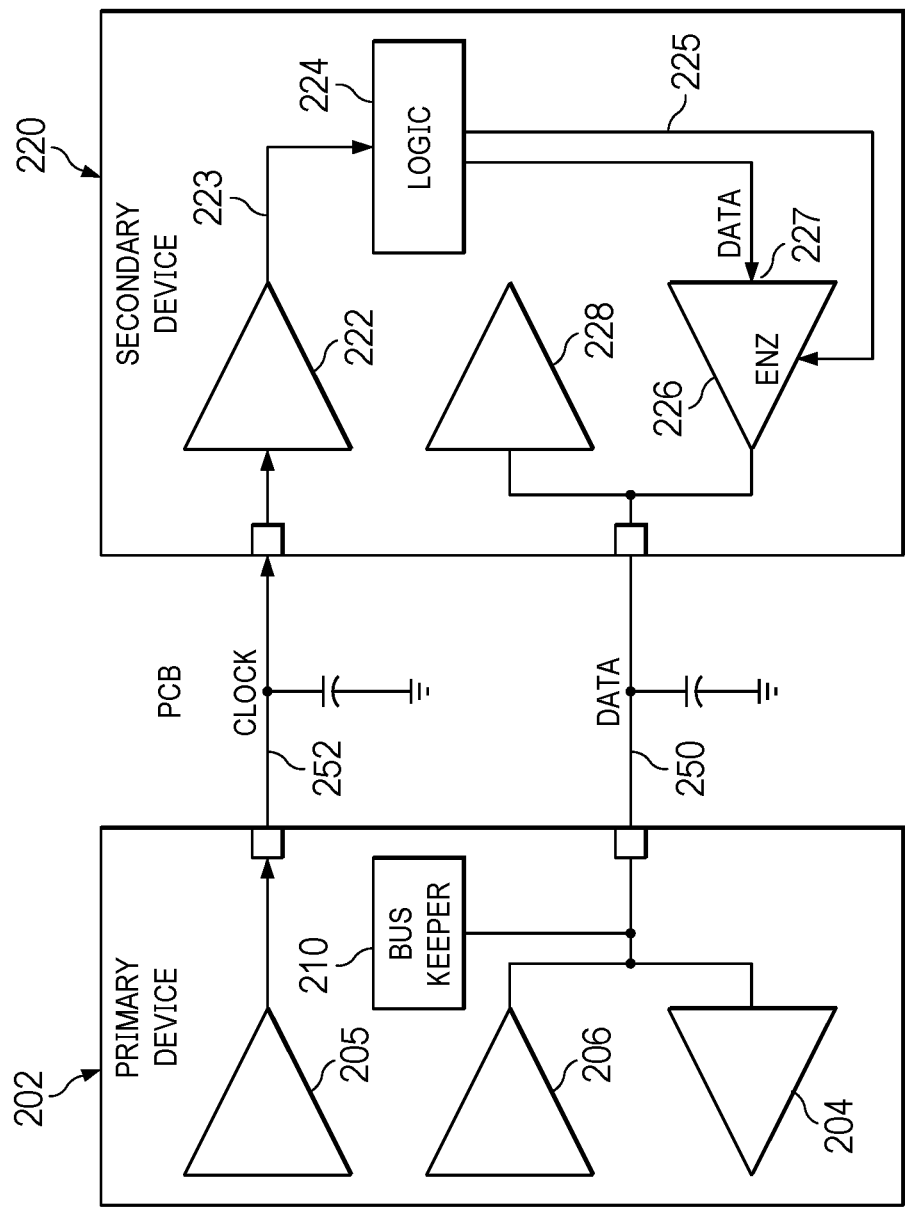
FIG. 2 is another block diagram of an audio system, in an embodiment.

FIG. 2 is a block diagram of a primary device 202 (e.g., audio processor 102) coupled to a secondary device 220 (e.g., DAC 132 or 138 or ADC 112 or 118). The primary device 202 includes a transmit buffer 205 to drive a clock signal 252 to the secondary device 220, where the clock signal 252 is provided to an input of a clock receive buffer 222. The clock receive buffer 222 receives the clock signal 252 and provides a clock signal 223 to logic circuit 224. The secondary device 220 also includes a data transmit buffer 226, which is used to drive data received at its input 227 across data bus 250 to a data receive buffer 204. The data bus 250 is bidirectional, and thus secondary device 220 also includes a data receive buffer 228, and primary device 202 includes a data transmit buffer 206. The primary device 202 includes a "bus keeper" circuit 210 coupled to the data bus 250. When none of the primary or secondary devices are actively driving the bus, the bus keeper 210 maintains the voltage on the data bus 250 at a logic level at which a primary or secondary device last drove the bus, rather than letting the voltage of the data bus 250 float.

In one implementation, primary device 202 may be implemented as an integrated circuit (IC), and secondary device 220 may be implemented as a separate IC. The ICs of primary device 202 and secondary device 220 may be mounted on a printed circuit board (PCB) and coupled together by way of conductive traces on the PCB.

Figure 3:
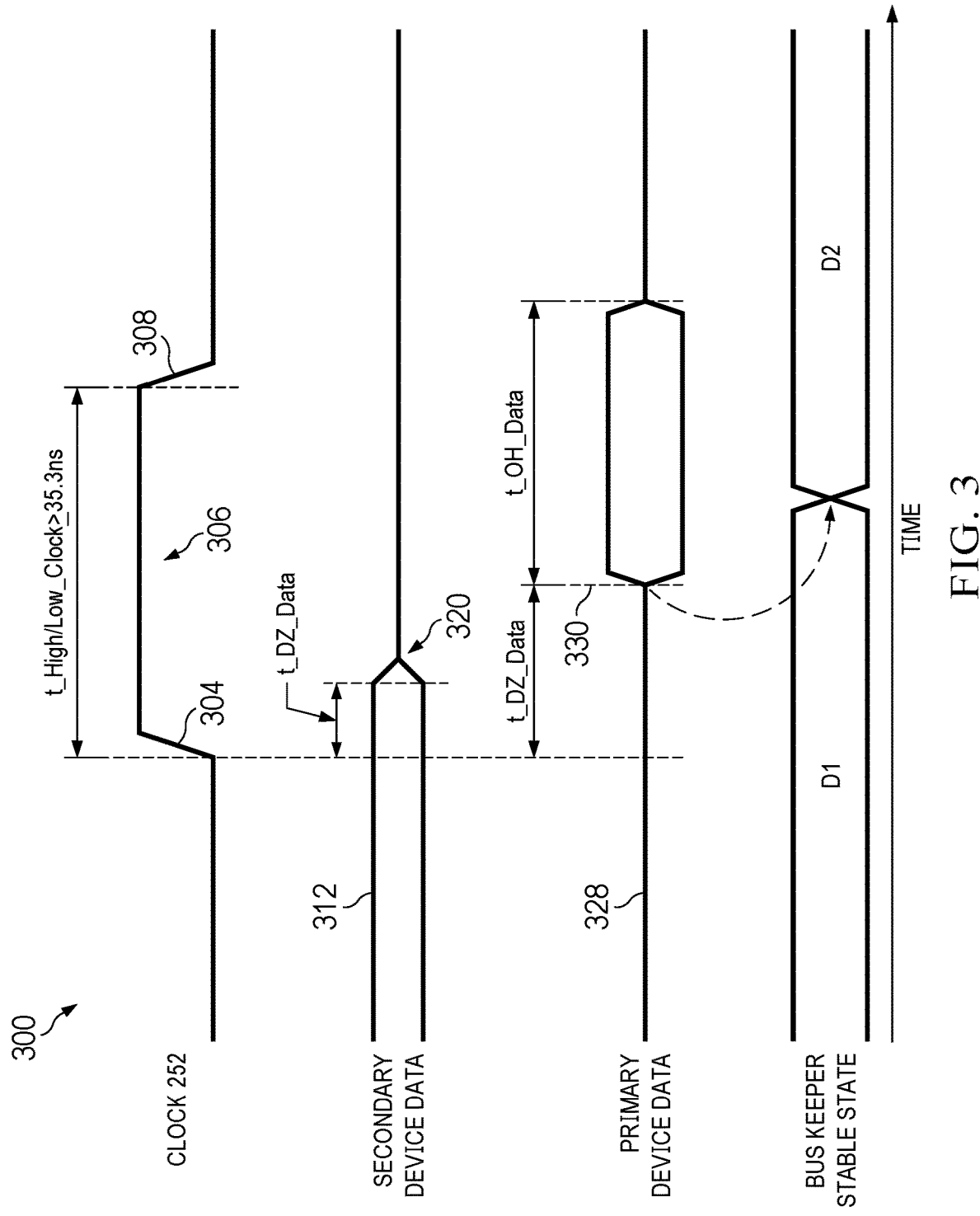
FIG. 3 is a timing diagram illustrating timing requirements of a particular bus protocol, in accordance with an embodiment.

FIG. 3 shows an example timing diagram 300. A pulse 306 is illustrated for the clock signal 252. The clock pulse 306 includes a rising edge 304 and a falling edge 308. In this timing example, the secondary device 220 has been actively driving (312) the data bus 250, and tristates its data transmit buffer 226 at time point 320. According to the Soundwire® protocol, the secondary device (or whichever device is current driving data on the data bus) must tristate its data transmit buffer within a period of time denoted as t_DZ_Data following the clock edge used by the secondary device to transmit its last bit. According to the Soundwire® protocol, the value of t_DZ_Data should be less than or equal to 4 ns (t_DZ_Data≤4 ns).

Until point 330, the primary device's data transmit buffer 206 has been tristated as indicated at 328. The next device to actively drive data on the data bus 250 must wait a period of time denoted as t_ZD_data following the previous clock edge, before such device can begin transmitted its own data. According to the Soundwire® protocol, t_ZD_Data should be greater than or equal to 7.9 ns (t_ZD_Data≥7.9 ns). At time point 330, the primary device 202 configures its data transmit buffer 226 to actively drive data on the shared data bus 250. The primary device actively drives its data bit for a period of time denoted as t_OH_Data. According to the Soundwire® protocol, t_OH_Data is greater than or equal to 6.7 ns (t_OH_Data≥6.7 ns).

Referring to FIGS. 2 and 3, the logic circuit 224 receives the clock signal 252 from the clock receive buffer 222. In one embodiment, the logic circuit 224 responds to clock edge 304 (e.g., the clock edge corresponding to the last bit to be transmitted by the secondary device) by controlling the logic state of a control signal 225 to a tristate control input (ENZ) of the data transmit buffer 226. For example, in response to the ENZ input being a logic 1, the data transmit buffer 226 is caused to transition from an active state to a tristate to thereby release the data bus 250 for use by another device.

The clock receive buffer 222 has a propagation delay. Thus, the logic circuit 224 detects the clock's rising edge after the propagation delay of the clock receive buffer 222. The logic circuit 224 also has a propagation delay for its circuitry to respond to a clock edge and force the control signal 225 to the logic state needed to cause the data transmit buffer 226 to be tristated. Further, the data transmit buffer 226 also has a propagation delay between receipt of a change in the logic state at its ENZ input and the time it ceases actively driving data on the data bus 250. The propagation delays of the clock receive buffer 222, logic circuit 224, and the data transmit buffer 226 are additive. For many semiconductor fabrication technologies, it may be very difficult to meet the 4 ns t_DZ_data requirement of the Soundwire® protocol, particularly at lower supply voltage levels.

Figure 4:
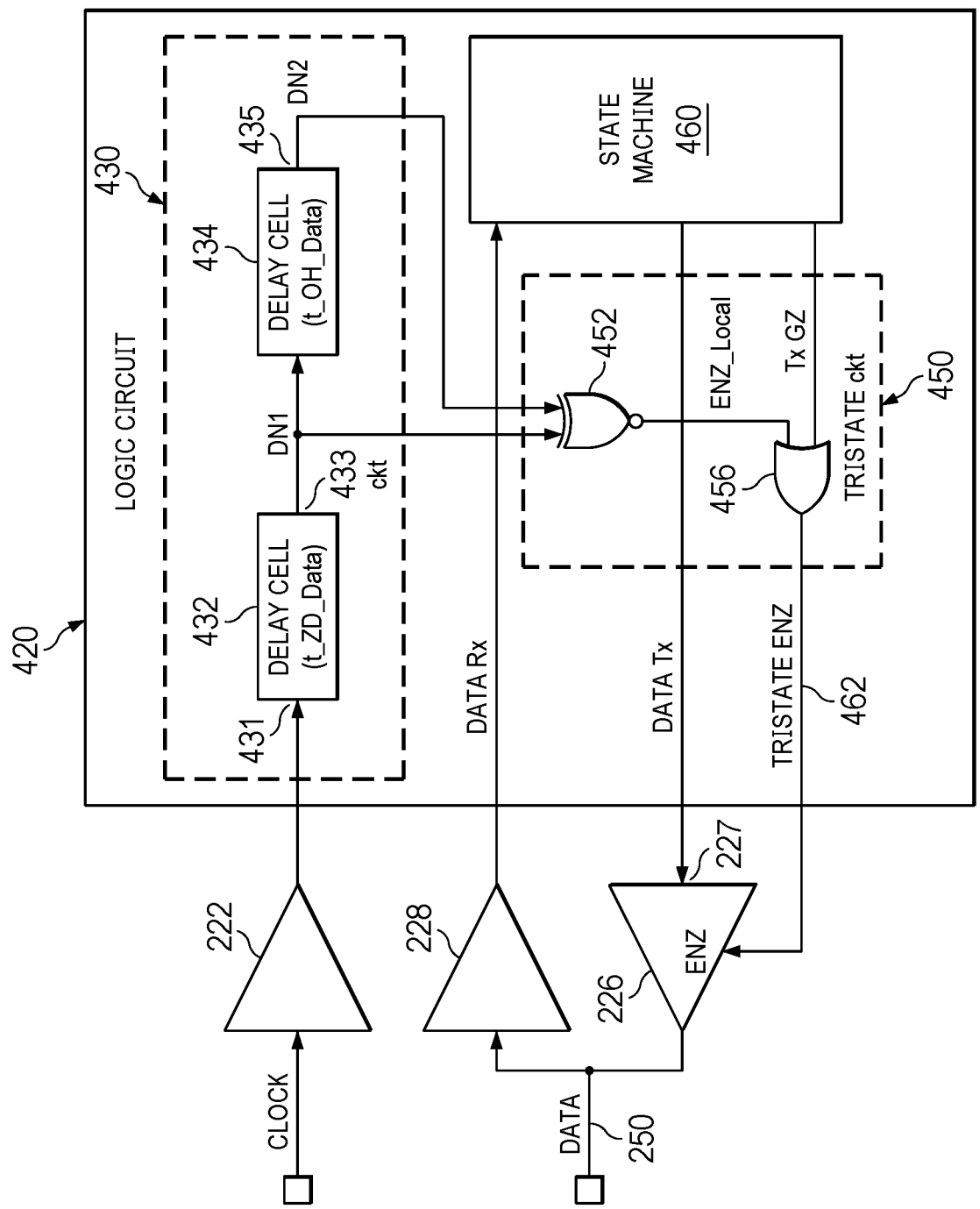
FIG. 4 is a schematic of a logic circuit usable in a device of a system, such as the audio system of FIGS. 1 and/or 2 to ensure compliance with one or more timing requirements of a bus protocol, in an embodiment.

FIG. 4 illustrates an embodiment for a device, e.g., a secondary device, containing a logic circuit 420 that meets the t_DZ_data requirement as well as the other timing requirements described above (e.g., t_ZD_Data≥7.9 ns and t_OH_Data≥6.7 ns). Logic circuit 420 has an input that is coupled to the output of the clock receive buffer 222. The logic circuit 420 includes a delay circuit 430, a tristate circuit 450, and a state machine 460. An output of the tristate circuit 450 is coupled to the enable ENZ input of the data transmit buffer 226 and asserts a control signal 462, Tristate ENZ, which, in one logic state (e.g., logic "1"), causes the data transmit buffer 226 to be tristated, and in another logic state (e.g., logic "0") permits data to be actively driven onto the data bus 250.

The delay circuit 430 includes delay circuits 432 and 434. The delay implemented by delay circuit 432 may be different (larger or smaller) than the delay implemented by delay circuit 434. The tristate circuit 450 includes logic gates 452 and 456. In this example, logic gate 452 is an exclusive-NOR gate (and thus referred to herein as exclusive-NOR gate 452) and logic gate 456 is an OR gate (and thus referred to herein as OR gate 456). Delay circuit 432 has an input 431 and an output 433. The output 433 provides a signal labeled DN1. The input 431 of delay circuit 432 is coupled to the output of the clock receive buffer 222. The output 433 of delay circuit 432 is coupled to the input of delay circuit 434. The output 433 of delay circuit 432 is coupled to an input of exclusive-NOR gate 452. The output 435 of delay cell 434 is coupled to another input of exclusive-NOR gate 452. The output 435 of delay circuit 434 provides a signal labeled DN2.

The output of exclusive-NOR gate 452 is coupled to an input of OR gate 456. Another input of OR gate 456 receives a signal labeled TX GZ. The state machine 460 generates the signal TX GZ. Data received from the data bus 250 through the data receiver buffer 228 is received and processed by the state machine 460. Similarly, the state machine 460 generates or otherwise provides data (Data TX) for transmission across the data bus 250 through the data transmit buffer 226. Data TX is provided to the data input 227 of the data transmit buffer 226.

Figure 5:
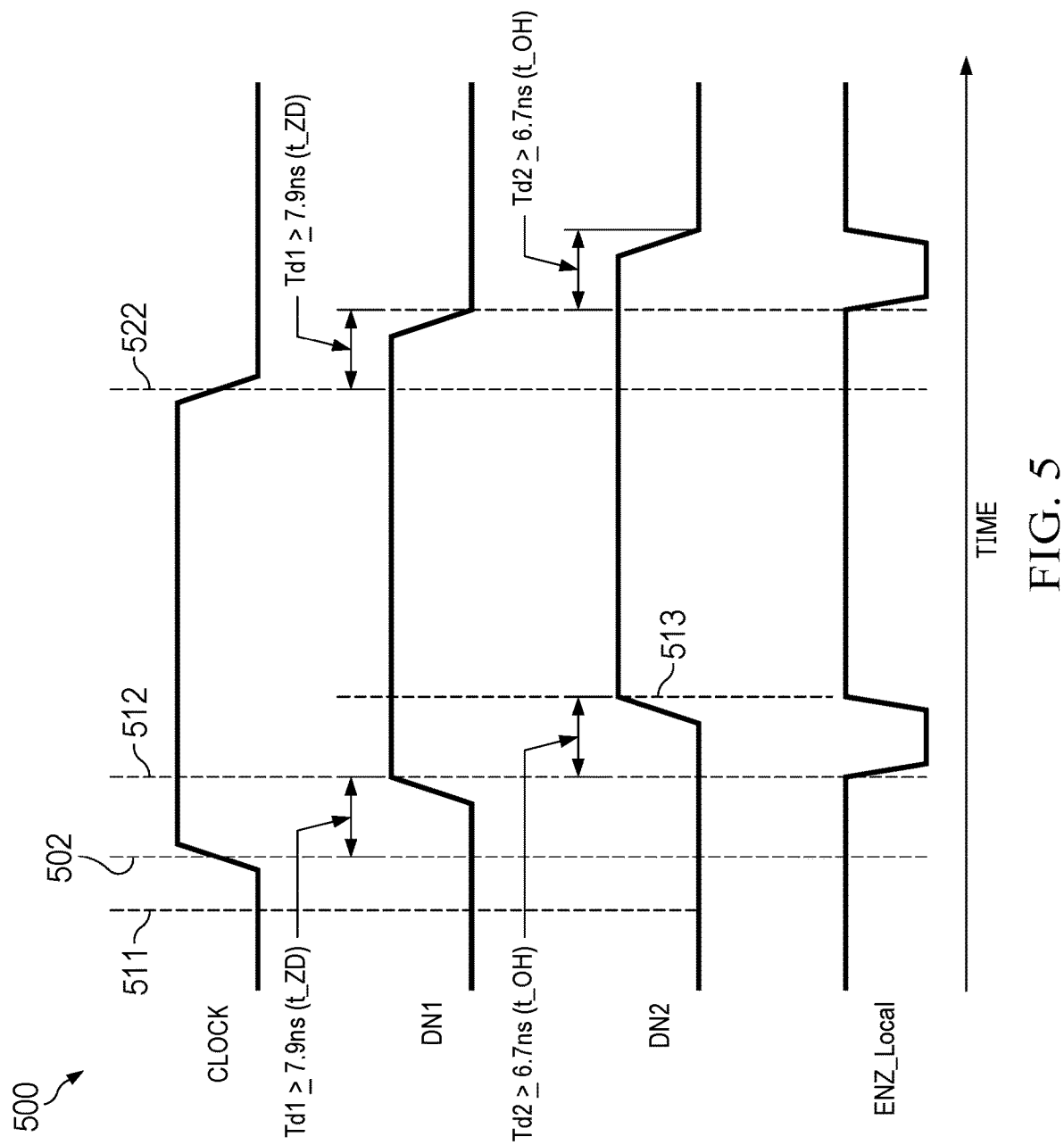
FIG. 5 is a timing diagram illustrating the operation of the logic circuit of FIG. 4, in an embodiment.

Each delay circuit 432 and 434 may be implemented, for example, as a series of logic gates (e.g., inverters) or by other delay circuit techniques by which the collective propagation delays of such logic gates are cumulative to provide an overall time delay through each delay cell. In one example, the time delay of the delay circuit 432 is t_ZD_Data, which is greater than or equal to 7.9 ns, and the time delay of delay circuit 434 is t_OH_Data, which is greater than or equal to 6.7 ns. During steady state of the clock signal (i.e., the clock signal is high or the clock signal is low), the outputs of the delay circuits 432 and 434 are at the same logic state. FIG. 5 is a timing diagram 500 corresponding to the operation of the logic circuit 420. At time point 511, the clock signal is logic low and thus signals DN1 and DN2 are also logic low. The output signals DN1 and DN2 of the delay circuits 432 and 434 are inputs to the exclusive-NOR gate 452. For exclusive-NOR gate inputs that are at the same logic level (both inputs being logic "0" or both inputs being logic "1"), the output of the exclusive-NOR gate is logic "1" (logic high). Upon receipt of a clock edge at the input of the delay circuit 430, the output of delay circuit 432 also changes logic state, but after the time delay corresponding to delay circuit 432. Until the output of delay circuit 432 changes logic state, both inputs to the exclusive-NOR gate 452 are at the same logic state (DN1=DN2="0" or "1"), and the output of exclusive-NOR gate 452 is logic "1." A logic "1" to the ENZ input of the data transmit buffer 226 causes the buffer to be tristated.

Following the time delay implemented by the delay circuit 432 (t_ZD_Data) from occurrence of a clock edge (e.g., rising clock edge 502) on the input of delay circuit 432 until the completion of the time delay implemented by delay cell 434 (e.g., between time points 512 and 513), the output signal DN1 of delay circuit 432 will be at a different logic state than the output signal DN2 of delay circuit 434. In the example of a rising clock edge 502, signal DN1 becomes logic 1 after the t_ZD_Data time delay from clock edge 502 while signal DN2 remains logic 0.

As a result of the inputs (signals DN1 and DN2) to the exclusive-NOR gate 452 being at different logic states (which is the case between time points 512 and 513), the output of the exclusive-NOR gate 452 will be a logic '0." A logic "0" to the ENZ input of the data transmit buffer 226 causes the buffer not to be tristated and thus to permit data to be transmitted through the buffer on to the data bus 250. The data transmit buffer 226 remains active to drive data on to the data bus 250 during the time delay t_OH_Data implemented by the delay cell 434.

Then, following the t_OH_Data time implemented by the delay cell 434, signal DN2 transitions to the same logic state as signal DN1. At time point 513, both signals DN1 and DN2 are logic "1." With both signals DN1 and DN2 being at the same logic state, the output signal ENZ_local from the exclusive-NOR gate 452 becomes logic 1, thereby causing the data transmit buffer 226 to again transition to the tristate. In this embodiment, therefore, the output buffer 226 remains tristated (as indicated by signals ENZ_local being logic "1" in FIG. 5 until the t_ZD_Data time delay implemented by delay circuit 432 after a clock edge (e.g., rising edge 502), and then the output buffer 226 becomes active to transmit data for the duration of the t_OH_Data time implemented by delay cell 434. The behavior of the logic circuit 420 is the same regardless of whether a rising or falling edge is present on the clock signal. The output buffer 226 is tristated most of the time and only released from the tristate condition just long enough to be used to transmit a data bit.

For the last bit a secondary device is to transmit, that secondary device's output data buffer advantageously is tristated immediately after transmission of that bit and considerably before occurrence of the next clock edge, which may be used by another device to drive data onto the bus. As described above in accordance with the SoundWire® protocol, the secondary device is obligated to tristate its output data buffer within 4 ns of the next clock edge. In the embodiment of FIG. 4, the logic circuit 420 causes the output buffer 226 to be tristated before the next clock edge even occurs.

In some embodiments, the primary device (e.g., audio processor 102 or primary device 202) determines which devices can access the data bus 250 at any point in time. The primary device transmits timing information to the secondary devices by which each secondary device is allocated a time slot to transmit data. The state machine 460 for a given secondary device asserts its TX GZ signal during time slots that are not mapped to that particular secondary device. The OR gate 456 generates the control signal Tristate ENZ 462 to the output data buffer 226 when either signal TX GZ or signal ENZ_Local is logic high.

In the context of the Soundwire® protocol and as described above, the minimum values of t_ZD_Data and t_OH_Data are 7.9 ns and 6.7 ns, respectively, meaning that the earliest a device can drive its first bit on the data bus is 7.9 ns after the previous clock edge (to allow time for the previous device to release the bus) and must hold that bit for a minimum of 6.7 ns. This means that for the embodiment of FIG. 4, each bit a device transmits (and the device may have multiple bits to sequentially transmit on the bus), the device waits for at least 7.9 ns to begin transmitting each such bit and also holds each respective bit for at least 6.7 ns.

Per the Soundwire® protocol, the values of 7.9 ns and 6.7 ns are minimum values and thus can be larger and still comply with the Soundwire® protocol. Those values, however, should not be so large that the device is still attempting to drive its data bit on the bus when the next clock edge occurs. If this condition were to occur, that is, the device is still transmitting a prior bit when the next clock edge occurs and the device needs to transmit its next bit, the device may change the logic level of its transmit data (Data TX) to reflect the next bit before the previous bit has been transmitted.

Figure 6:
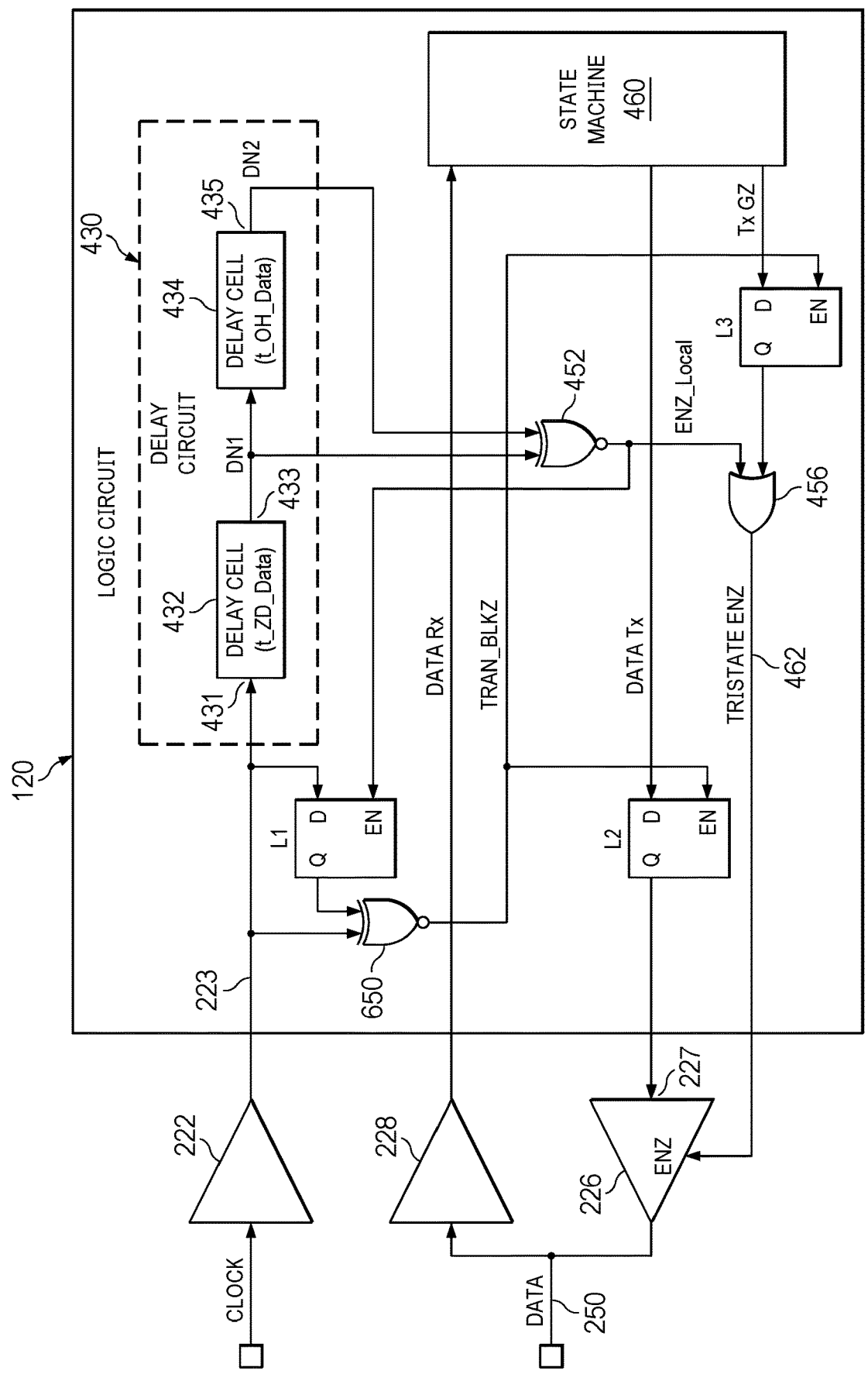
FIG. 6 is a schematic of another logic circuit usable in a device of a system, such as the audio system of FIGS. 1 and/or 2 to ensure compliance with one or more timing requirements of a bus protocol, in another embodiment.

FIG. 6 is a block diagram of an alternative embodiment, which avoids the contention problem described above. The delay circuits 432 and 434 should be designed to have appropriate lengths of their respective time delays, but it is possible that their time delays could be too long. The embodiment of FIG. 6 adds robustness to the logic circuit 420 of FIG. 4 to avoid the contention problem in the event the time delays are too long.

Some of the components and circuitry are the same in FIG. 6 as in FIG. 4, and thus the same reference numbers are used in FIG. 6. The logic circuit 620 of FIG. 6 includes the delay circuit 430 (which has the delay circuits 432 and 434 as described above), exclusive-NOR gate 452, OR gate 456, and state machine 460. Logic circuit 620 also includes latches L1, L2, and L3, and exclusive-NOR gate 650. In this example, each latch L1, L2, and L3 is a transparent latch which provides the logic signal on its data (D) input through to its output (Q) as long as the enable (EN) control input is at a given logic state (logic high in this example). In response to the EN control input being forced to the other logic state (logic low in this example), the Q output is held fixed and changes in the D input are not provided through to the Q output.

The output of the clock buffer 222 is coupled to the D input of latch L1 and to one input of exclusive-NOR gate 650. The Q output of latch L1 is coupled to the other input of exclusive-NOR gate 650. The output of exclusive-NOR gate 650 is coupled to the enable (EN) inputs of latches L2 and L3. The signal on the output of exclusive-NOR gate 650 is labeled TRAN_BLKZ. When signal TRAN_BLKZ is logic high, latches L2 and L3 are configured for transparent operation in which the signals on their D inputs are provided to their Q outputs. Data Tx is provided to the D input of latch L2, and TX GZ is provided to the D input of latch L3. The Q output of latch L3 is coupled to an input of OR gate 456, and, as described above, the output of exclusive-NOR gate 452 is coupled to the other input of OR gate 456. The output of OR gate 456 provides the signal Tristate ENZ and is coupled to the ENZ control input of the transmit data buffer 226. The Q output of latch L2 is provided to the data input 227 of the transmit data buffer 226.

Figure 7:
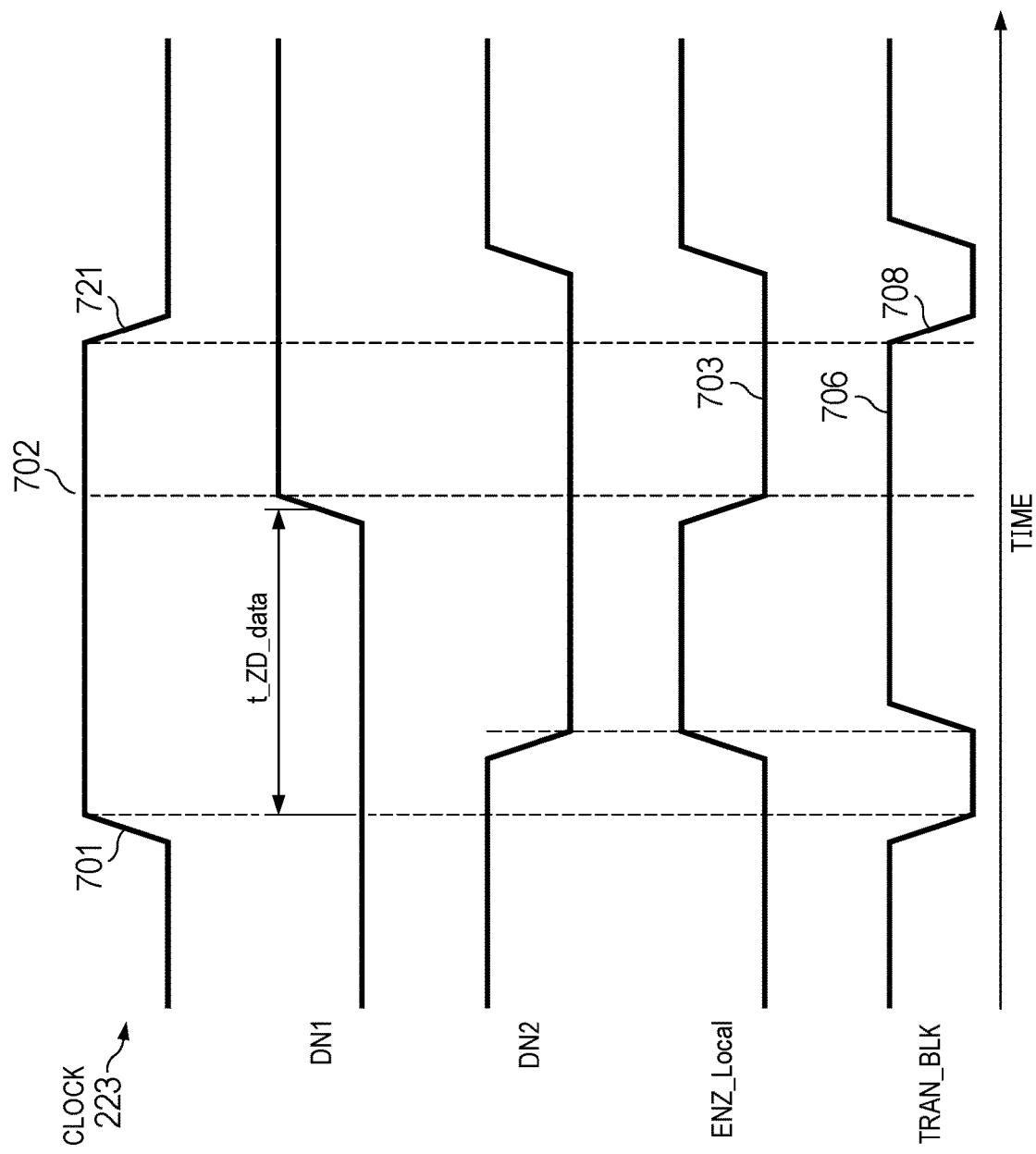
FIG. 7 is a timing diagram illustrating the operation of the logic circuit of FIG. 6, in an embodiment.

Referring to FIG. 6 and the corresponding timing diagram of FIG. 7, when DN1 changes logic state (after the t_ZD_Data time delay following clock edge 701 in the example of FIG. 7), as described above, the output signal ENZ_Local of the exclusive-NOR gate 452 becomes logic "0" (see reference numeral 703). Signal ENZ_Local being a logic "0" occurs when a data bit (Data TX) is being transmitted on to data bus 250. Signal ENZ_Local becoming logic "0" disables latch L1 thereby sampling the signal level of clock on the output of the clock buffer 222 (signal 223). In the example of FIG. 7, the clock signal 223 is logic high the moment that ENZ_Local becomes logic "0" and thus the clock signal 223 is sampled at time point 702. That value of the clock signal 223 (at time point 702) is provided by latch L1 to one input of the exclusive-NOR gate 650. The other input of the exclusive-NOR gate 650 is coupled to the clock signal 223. With both clock signal 223 and the sampled clock being logic "1," exclusive-NOR gate 650 forces TRAN_BLKZ to a logic "1" state As a result of TRAN_BLKZ being logic "1," latches L2 and L3 are configured for transparent operation. With latch L2 operating transparently, signal Data TX is provided through latch L2 to the data input 227 of the data transmit buffer 226. With latch L3 operating transparently, signal TX GZ is provided through latch L3 to an input of OR gate 456.

In the example of FIG. 7, the next clock edge 721 occurs before the previous bit has completed its transmission (EN-Z_Local is still logic "0" when the next clock edge 721 occurs). Clock edge 721 causes the current level of the clock signal 223 to be logic "0" while the previously sampled clock signal level at the Q output of latch L1 is logic "1." Because the input signals to the exclusive-NOR gate 650 are at different logic levels, exclusive-NOR gate 650 forces TRAN_BLK to the logic "0" level (see falling edge 708). With signal TRAN_BLK at the logic "0" level, latches L2 and L3 are disabled and any further changes in Data Tx or TX GZ have no effect in the circuit. For example, any change in the logic level of Data TX is prevented from reaching the data input 227 of the data transmit buffer 226 due to latch L2 being disabled. Similarly, any change in the logic level of TX GZ is prevented from reaching the input of OR gate 456 due to latch L3 being disabled. Accordingly, the current bit is able to finish being transmitted.

In this description, the term "couple" may cover connections, communications, or signal paths that enable a functional relationship consistent with this description. For example, if device A generates a signal to control device B to perform an action: (a) in a first example, device A is coupled to device B by direct connection; or (b) in a second example, device A is coupled to device B through intervening component C if intervening component C does not alter the functional relationship between device A and device B, such that device B is controlled by device A via the control signal generated by device A.

Also, in this description, the recitation "based on" means "based at least in part on." Therefore, if X is based on Y, then X may be a function of Y and any number of other factors.

A device that is "configured to" perform a task or function may be configured (e.g., programmed and/or hardwired) at a time of manufacturing by a manufacturer to perform the function and/or may be configurable (or reconfigurable) by a user after manufacturing to perform the function and/or other additional or alternative functions. The configuring may be through firmware and/or software programming of the device, through a construction and/or layout of hardware components and interconnections of the device, or a combination thereof.

While certain elements of the described examples are included in an integrated circuit and other elements are external to the integrated circuit, in other example embodiments, additional or fewer features may be incorporated into the integrated circuit. In addition, some or all of the features illustrated as being external to the integrated circuit may be included in the integrated circuit and/or some features illustrated as being internal to the integrated circuit may be incorporated outside of the integrated. As used herein, the term "integrated circuit" means one or more circuits that are: (i) incorporated in/over a semiconductor substrate; (ii) incorporated in a single semiconductor package; (iii) incorporated into the same module; and/or (iv) incorporated in/on the same printed circuit board.

Uses of the phrase "ground" in the foregoing description include a chassis ground, an Earth ground, a floating ground, a virtual ground, a digital ground, a common ground, and/or any other form of ground connection applicable to, or suitable for, the teachings of this description. In this description, unless otherwise stated, "about," "approximately" or "substantially" preceding a parameter means being within +/−10 percent of that parameter or, if the parameter is zero, a reasonable range of values around zero.

Modifications are possible in the described embodiments, and other embodiments are possible, within the scope of the claims.

What is claimed is:

1. An integrated circuit (IC), comprising:
an input buffer having a buffer output;
a first delay circuit having a first delay circuit input and a first delay circuit output, the first delay circuit input coupled to the buffer output;
a second delay circuit having a second delay circuit input and a second delay circuit output, the second delay circuit input coupled to the first delay circuit output;
a first logic gate having a first logic gate input, a second logic gate input, and a first logic gate output, the first logic gate input coupled to the first delay circuit output, and the second logic gate input coupled to the second delay circuit output;
a second logic gate having a third logic gate input, a fourth logic gate input, and a second logic gate output, the third logic gate input coupled to the first logic gate output; and
a tristatable output buffer having a control input, the control input coupled to the second logic gate output.

2. The IC of claim 1, wherein the first delay circuit is configured to implement a first delay value, and the second delay circuit is configured to implement a second delay value, and the first delay value is different than the second delay value.

3. The IC of claim 1, wherein the first logic gate is an exclusive-NOR gate.

4. The IC of claim 1, wherein the second logic gate is an OR gate.

5. The IC of claim 1, further comprising:
a latch having a data input and an enable input, and a latch output; and
a third logic gate having a fifth logic gate input and a sixth logic gate input, the fifth logic gate input coupled to the first delay circuit input, and the sixth logic gate input coupled to the latch output.

6. The IC of claim 5, wherein the data input of the latch is coupled to the first delay circuit input, and the enable input of the latch is coupled to the first logic gate output.

7. The IC of claim 6, wherein the latch is a first latch and the third logic gate has a third logic gate output, the IC further comprising:
a second latch having a second enable input coupled to the third logic gate output.

8. An integrated circuit (IC), comprising:
a tristatable output buffer having a control input;
an input buffer having a buffer output;
a delay circuit having a delay circuit input, a first delay circuit output, and a second delay circuit output, the delay circuit input coupled to the buffer output;
a tristate circuit coupled to the first delay circuit output and to the second delay circuit output, and the tristate circuit having a tristate circuit output coupled to the control input;

a first latch having a first latch input, a first enable input, and a first latch output;
a logic gate having a first logic gate input, a second logic gate input, and a logic gate output, the first logic gate input coupled to the delay circuit input, and the second logic gate input coupled to the first latch output; and
a second latch having a second enable input and a second latch output, the second enable input coupled to the logic gate output, and the second latch output coupled to the control input.

9. The IC of claim 8, wherein the delay circuit comprises:
a first delay circuit having the delay circuit input and the first delay circuit output, and
a second delay circuit coupled to the first delay circuit output, the second delay circuit having the second delay circuit output.

10. The IC of claim 9, wherein the first delay circuit is configured to implement a first delay value, and the second delay circuit is configured to implement a second delay value, and the first delay value is different than the second delay value.

11. The IC of claim 10, wherein the first delay value is larger than the second delay value.

12. The IC of claim 8, wherein the tristate circuit comprises an exclusive-NOR gate.

13. The IC of claim 8, wherein the tristate circuit comprises:
an exclusive-NOR gate having a first exclusive-NOR gate input, a second exclusive-NOR gate input, and an exclusive-NOR gate output, the first exclusive-NOR gate input coupled to the first delay circuit output, and the second exclusive-NOR gate input coupled to the second delay circuit output; and
an OR gate having a first OR gate input, a second OR gate input, and an OR gate output, the first OR gate input coupled to the exclusive-NOR gate output, and the OR gate output coupled to the control input.

14. The IC of claim 8, wherein the logic gate is an exclusive-NOR gate.

15. An integrated circuit (IC), comprising:
an input buffer having a clock input and a buffer output;
a tristatable output buffer having a control input;
a first delay circuit having an input coupled to the buffer output and having a first delay circuit output;
a second delay circuit having a second delay circuit input and a second delay circuit output, the second delay circuit input coupled to the first delay circuit output; and
a tristate circuit coupled to the first delay circuit output and to the second delay circuit output, and the tristate circuit having a tristate circuit output coupled to the control input.

16. The IC of claim 15, wherein the first delay circuit is configured to implement a first delay value, and the second delay circuit is configured to implement a second delay value, and the first delay value is different than the second delay value.

17. The IC of claim 15, wherein the tristate circuit comprises:
an exclusive-NOR gate having a first exclusive-NOR gate input, a second exclusive-NOR gate input, and an exclusive-NOR gate output, the first exclusive-NOR gate input coupled to the first delay circuit output, and the second exclusive-NOR gate input coupled to the second delay circuit output; and
an OR gate having an OR gate input and an OR gate output, the OR gate input coupled to the exclusive-NOR gate output, and the OR gate output coupled to the control input.

18. The IC of claim 17, wherein the tristatable output buffer is a transmit buffer having an input and the OR gate having a second input, and the IC further comprising:
a receive buffer having an output; and
circuitry coupled to the output of the receive buffer, the input of the transmit buffer, and the second input of the OR gate, and configured to receive a first audio signal from the receive buffer, provide a second audio signal to the transmit buffer, and provide a tristate control signal to the OR gate.

19. The IC of claim 15, further comprising:
a first latch having a first latch input, a first enable input, and a first latch output;
a logic gate having a first logic gate input, a second logic gate input, and a logic gate output, the first logic gate input coupled to the delay circuit input, and the second logic gate input coupled to the first latch output; and
a second latch having a second enable input and a second latch output, the second enable input coupled to the logic gate output, and the second latch output coupled to the control input.

20. The IC of claim 15, in which the input buffer and tristatable output buffer are included in physical layer circuitry.

* * * * *